US010879082B2

(12) United States Patent
Smirnov et al.

(10) Patent No.: US 10,879,082 B2
(45) Date of Patent: Dec. 29, 2020

(54) WAVELIKE HARD NANOMASK ON A TOPOGRAPHIC FEATURE AND METHODS OF MAKING AND USING

(71) Applicant: Wostec, Inc., San Francisco, CA (US)

(72) Inventors: Valery K. Smirnov, Yaroslavl (RU); Dmitry S. Kibalov, Yaroslavl (RU)

(73) Assignee: Wostec, Inc., San Francisco, CA (US)

( * ) Notice: Subject to any disclaimer, the term of this patent is extended or adjusted under 35 U.S.C. 154(b) by 16 days.

(21) Appl. No.: 16/669,140

(22) Filed: Oct. 30, 2019

(65) Prior Publication Data

US 2020/0075348 A1 Mar. 5, 2020

Related U.S. Application Data

(63) Continuation of application No. 15/320,241, filed as application No. PCT/RU2014/000458 on Jun. 26, 2014, now abandoned.

(51) Int. Cl.
*B82Y 30/00* (2011.01)
*H01L 21/3213* (2006.01)
(Continued)

(52) U.S. Cl.
CPC ........ *H01L 21/32139* (2013.01); *B82Y 10/00* (2013.01); *B82Y 40/00* (2013.01); *H01L 21/0337* (2013.01); *H01L 21/266* (2013.01); *H01L 21/3086* (2013.01); *H01L 21/3088* (2013.01); *H01L 29/0676* (2013.01); *H01L 29/66439* (2013.01); *H01L 29/66469* (2013.01); *B82Y 20/00* (2013.01); *B82Y 30/00* (2013.01)

(58) Field of Classification Search
None
See application file for complete search history.

(56) References Cited

U.S. PATENT DOCUMENTS 4,009,933 A 3/1977 Firester
4,072,541 A 2/1978 Meulenberg et al.
(Continued)

FOREIGN PATENT DOCUMENTS

CN 101486442 7/2009
RU 2141699 C1 11/1999
(Continued)

OTHER PUBLICATIONS

International Search Report and Written Opinion for International Patent Application No. PCT/RU2011/000489 dated Mar. 1, 2012.
(Continued)

*Primary Examiner* — Kenneth Parker
*Assistant Examiner* — Christopher A Culbert
(74) *Attorney, Agent, or Firm* — Lowe Graham Jones PLLC; Bruce E. Black (57) ABSTRACT

An array of nanowires with a period smaller than 150 nm can be used for optoelectronics and semiconductor electronics applications. A hard nanomask is registered to a lithographically defined feature and can be used to manufacture such structures. This nanomask includes a substantially periodic array of substantially parallel elongated elements having a wavelike cross-section. The fabrication method of the nanomask may be contactless and uses ion beams.

20 Claims, 9 Drawing Sheets (51) Int. Cl.
*H01L 21/308* (2006.01)
*B82Y 40/00* (2011.01)
*H01L 29/66* (2006.01)
*B82Y 10/00* (2011.01)
*H01L 21/033* (2006.01)
*H01L 29/06* (2006.01)
*H01L 21/266* (2006.01)
*B82Y 20/00* (2011.01)

(56) References Cited

U.S. PATENT DOCUMENTS

| | | |
|---|---|---|
| 4,233,109 A | 11/1980 | Nishizawa |
| 4,400,409 A | 8/1983 | Izu et al. |
| 4,460,434 A | 7/1984 | Johnson et al. |
| 4,556,524 A | 12/1985 | Cullis et al. |
| 4,857,080 A | 8/1989 | Baker et al. |
| 5,160,618 A | 11/1992 | Burggraaf et al. |
| 5,412,500 A | 5/1995 | Fergason |
| 5,473,138 A | 12/1995 | Singh et al. |
| 5,498,278 A | 3/1996 | Edlund |
| 5,530,272 A | 6/1996 | Kudo et al. |
| 5,578,379 A | 11/1996 | Stutzmann et al. |
| 5,652,020 A | 7/1997 | Collins et al. |
| 5,663,592 A | 9/1997 | Miyazawa et al. |
| 5,702,503 A | 12/1997 | Tse Tang |
| 5,734,092 A | 3/1998 | Wang et al. |
| 5,747,180 A | 5/1998 | Miller et al. |
| 5,753,014 A | 5/1998 | Van Rijn |
| 6,258,617 B1 | 7/2001 | Nitta et al. |
| 6,274,007 B1 | 8/2001 | Smirnov et al. |
| 6,417,939 B1 | 7/2002 | Laude |
| 6,452,724 B1 | 9/2002 | Hansen et al. |
| 6,518,194 B2 | 2/2003 | Winningham et al. |
| 6,580,172 B2 | 6/2003 | Mancini et al. |
| 6,667,240 B2 | 12/2003 | Ozaki et al. |
| 6,706,576 B1 | 3/2004 | Ngo et al. |
| 6,810,899 B2 | 11/2004 | Franz et al. |
| 6,954,275 B2 | 10/2005 | Choi et al. |
| 7,001,446 B2 | 2/2006 | Roark et al. |
| 7,175,694 B2 | 2/2007 | Ma et al. |
| 7,265,374 B2 | 9/2007 | Lee et al. |
| 7,338,275 B2 | 3/2008 | Choi et al. |
| 7,384,792 B1 | 6/2008 | Wang et al. |
| 7,453,565 B2 | 11/2008 | Wang et al. |
| 7,604,690 B2 | 10/2009 | Smirnov et al. |
| 7,768,018 B2 | 8/2010 | Srriirnov et al. |
| 7,772,079 B2 | 8/2010 | Meng et al. |
| 7,791,190 B2 | 9/2010 | Flores et al. |
| 7,977,252 B2 | 7/2011 | Smirnov et al. |
| 8,033,706 B1 | 10/2011 | Kelly et al. |
| 8,426,320 B2 | 4/2013 | Smirnov et al. |
| 8,859,440 B2 | 10/2014 | Smirnov et al. |
| 8,859,888 B2 | 10/2014 | Smirnov et al. |
| 2002/0074307 A1 | 6/2002 | Cotteverte et al. |
| 2002/0142704 A1 | 10/2002 | Hu et al. |
| 2002/0154403 A1 | 10/2002 | Trotter |
| 2002/0170497 A1 | 11/2002 | Smirnov et al. |
| 2003/0111106 A1 | 6/2003 | Nagano et al. |
| 2003/0152787 A1 | 8/2003 | Arakawa et al. |
| 2003/0171076 A1 | 9/2003 | Moloney et al. |
| 2003/0183270 A1 | 10/2003 | Falk et al. |
| 2003/0218744 A1 | 11/2003 | Shalaev et al. |
| 2004/0070829 A1 | 4/2004 | Kurtz et al. |
| 2004/0129135 A1 | 7/2004 | Roark et al. |
| 2004/0174596 A1 | 9/2004 | Umeki |
| 2004/0190116 A1 | 9/2004 | Lezec et al. |
| 2004/0201890 A1 | 10/2004 | Crosby |
| 2004/0238851 A1 | 12/2004 | Flores et al. |
| 2005/0046943 A1 | 3/2005 | Suganuma |
| 2005/0130072 A1* | 6/2005 | Koeda ............... G02B 5/1857 430/321 |
| 2006/0043400 A1 | 3/2006 | Erchak et al. |
| 2006/0159958 A1 | 7/2006 | Lee |
| 2006/0205875 A1 | 9/2006 | Cha et al. |
| 2006/0210886 A1 | 9/2006 | Mizuyama et al. |
| 2006/0230937 A1 | 10/2006 | Smirnov et al. |
| 2006/0273067 A1 | 12/2006 | Smirnov et al. |
| 2006/0279843 A1 | 12/2006 | Kurt et al. |
| 2007/0012355 A1 | 1/2007 | LoCascio et al. |
| 2007/0082457 A1 | 4/2007 | Chou et al. |
| 2007/0217008 A1 | 9/2007 | Wang et al. |
| 2008/0072958 A1 | 3/2008 | Dutta |
| 2008/0119034 A1 | 5/2008 | Smirnov et al. |
| 2008/0128727 A1 | 6/2008 | Erchak et al. |
| 2008/0135864 A1 | 6/2008 | David et al. |
| 2008/0169479 A1 | 7/2008 | Xu et al. |
| 2009/0118605 A1 | 5/2009 | Van Duyne et al. |
| 2009/0162966 A1 | 6/2009 | Jawarani et al. |
| 2009/0214885 A1 | 8/2009 | Her et al. |
| 2010/0110551 A1 | 5/2010 | Lamansky et al. |
| 2010/0171949 A1 | 7/2010 | Mazur et al. |
| 2010/0195204 A1 | 8/2010 | Walker |
| 2010/0276612 A1 | 11/2010 | Norwood et al. |
| 2010/0300893 A1 | 12/2010 | Suh et al. |
| 2011/0197959 A1 | 8/2011 | Catchpole et al. |
| 2011/0232744 A1 | 9/2011 | Larsen et al. |
| 2011/0248386 A1 | 10/2011 | Smirnov et al. |
| 2012/0176766 A1 | 7/2012 | Natsumeda |
| 2012/0195335 A1 | 8/2012 | Kalosha et al. |
| 2012/0314189 A1 | 12/2012 | Natsumeda et al. |
| 2013/0008497 A1* | 1/2013 | Smirnov ............... B82Y 30/00 136/256 |
| 2013/0057938 A1 | 3/2013 | Natsumeda et al. |
| 2013/0228730 A1 | 9/2013 | Smirnov et al. |
| 2014/0030531 A1 | 1/2014 | Mori |
| 2014/0151715 A1 | 6/2014 | Smirnov et al. |
| 2014/0352779 A1 | 12/2014 | Smirnov et al. |
| 2015/0042988 A1 | 2/2015 | Smirnov et al. |
| 2016/0018579 A1 | 1/2016 | Smirnov et al. |
| 2016/0336036 A1 | 11/2016 | Bhaskaran et al. |
| 2017/0068104 A1 | 3/2017 | Ouderkirk et al. |

FOREIGN PATENT DOCUMENTS

| | | |
|---|---|---|
| RU | 2152108 C1 | 6/2000 |
| RU | 2173003 C2 | 8/2001 |
| RU | 2180885 C1 | 3/2002 |
| RU | 2204179 C1 | 5/2003 |
| RU | 2231171 C1 | 6/2004 |
| RU | 2240280 C1 | 11/2004 |
| RU | 2321101 C1 | 3/2008 |
| TW | 200939471 A | 9/2009 |
| WO | 2000017094 | 3/2000 |
| WO | 2003032398 | 4/2003 |
| WO | 2005050697 A2 | 6/2005 |
| WO | 2010072862 | 7/2010 |
| WO | 2011044687 | 4/2011 |
| WO | 2012009467 | 1/2012 |

OTHER PUBLICATIONS

International Search Report and Written Opinion for International Patent Application No. PCT/RU2011/000631 dated Mar. 1, 2012.
International Search Report and Written Opinion for International Patent Appiication No. PCT/RU2011/00594 dated Apr. 19, 2012.
International Search Report and Written Opinion for International Patent Application No. PCT/US2006/011420 dated Jun. 26, 2008.
International Search Report and Written Opinion for International Patent Application No. PCT/US2006/021564 dated Jul. 28, 2008.
Karen, A. et al., "Quantitative Investigation of the O2+-Induved Topography of GaAs and other III-V Semiconductors: an STM Study of the Ripple Formation and Suppression of the Secondary Ion Yield Change by Sample Rotation," Surface and Interface Analysis, vol. 23, 1995, pp. 506-513.
Scott, K.L. et al., "Pattern Generators and Microcolumns for Ion Beam Lithography," Journal of Vacuum Science Technology B, 18(6) 2000, pp. 3172-3176.
Vajo, J.J. et al., "Influence of O2+ Energy, Flux, and Fluence on the Formation and Growth of Sputtering-Induced Ripple Topography on Silicon," Journal of Vacuum Science and Tecnolody A, 14(5), 1996, pp. 2709-2720.

(56) References Cited

OTHER PUBLICATIONS

Official Communication for U.S. Appl. No. 11/421,384 dated Aug. 21, 2008.
Official Communication for U.S. Appl. No. 11/421,384 dated Apr. 24, 2009.
Official Communication for U.S. Appl. No. 11/421,384 dated Sep. 3, 2009.
Official Communication for U.S. Appl. No. 13/164,387 dated Sep. 6, 2012.
Official Communication for U.S. Appl. No. 13/407,615 dated Mar. 28, 2014.
European Search Report for European Application No. 06851545.1 dated Feb. 8, 2010.
Official Communication for U.S. Appl. No. 13/859,442 dated May 2, 2014.
Official Communication for U.S. Appl. No. 13/859,442 dated Oct. 18, 2013.
Official Communication for U.S. Appl. No. 13/859,442 dated Mar. 27, 2014.
Official Communication for U.S. Appl. No. 11/100,175 dated Oct. 24, 2007.
Official Communication for U.S. Appl. No. 11/100,175 dated May 16, 2008.
Official Communication for U.S. Appl. No. 11/100,175 dated Feb. 9, 2009.
Chapter 7 in the book Sputtering by Particle Bombardment II: Sputtering of Alloys and Compounds, Electron and Neuron Sputtering, Surface Topography, Edited by R. Behrisch, 1983, Springer-Verlag, Berlin-Heidelberg-New York-Tokyo.
Mishra et al. Effect of initial target surface roughness on the evolution of ripple topography induced by oxygen sputtering of Al films, Journal of Applied Physics, vol. 105, 2009, 7 pages.
International Search Report and Written Opinion for PCT/RU2011/000977 dated Sep. 6, 2012.
International Search Report and Written Opinion for PCT/RU2014/000458 dated Feb. 5, 2015.
International Search Report and Written Opinion for PCT/RU2012/000016 dated Sep. 13, 2012.
International Search Report and Written Opinion for PCT/RU2012/000210 dated Dec. 20, 2012.
International Search Report and Written Opinion for PCT/RU2013/000192 dated Dec. 5, 2013.
Supplementary European Search Report for EP Application No. 11870692.8 dated Feb. 11, 2015.
Keller et al., "Optical and structural properties of GaN nanopillar and nanostripe arrays with embedded InGaN/GaN rnultiquantum wells", Journal of Applied Physics, 100 (2006): pp. 054314-1 to 054314-7.
Official Communication for U.S. Appl. No. 14/172,505 dated Mar. 30, 2015.
Official Communication for U.S. Appl. No. 14/172,505 dated Jun. 30, 2015.
Official Communication for U.S. Appl. No. 14/775,658 dated Feb. 19, 2016.
International Search Report and Written Opinion for PCT Application No. PCT/RU2016/000796 dated Sep. 7, 2017.
International Search Report and Written Opinion for PCT Application No. PCT/RU2017/000338 dated Nov. 16, 2017.
International Search Report and Written Opinion for PCT Application No. PCT/RU2017/000095 dated Nov. 16, 2017.
International Search Report and Written Opinion for PCT Application No. PCT/RU2017/000714 dated Aug. 2, 2018.
Official Communication for U.S. Appl. No. 15/320,241 dated Jan. 22, 2019.
Official Communication for U.S. Appl. No. 15/320,241 dated Jul. 30, 2019.

* cited by examiner

WAVELIKE HARD NANOMASK ON A TOPOGRAPHIC FEATURE AND METHODS OF MAKING AND USING

CROSS-REFERENCE TO RELATED APPLICATIONS

This present application is a continuation of U.S. patent application Ser. No. 15/320,241, filed Dec. 19, 2016, which is the U.S. national stage application of PCT Application No. PCT/RU2014/000458, filed Jun. 26, 2014, both of which are hereby incorporated by reference in their entirety.

FIELD

The invention relates to methods and devices for forming wavy (wavelike) patterns with a period of about 150 nm or less on the surface of materials using ion fluxes. The invention also relates to methods and devices for forming wavelike nanopatterns by ion beams on a surface of lithographically defined topographic features designed to improve the pattern quality.

BACKGROUND

Self-formation phenomena can be used for forming periodic nanoline patterns. However, defects such as line bends, breaks, and joints are inherent in self-formed patterns and make difficult their application in semiconductor microelectronics.

BRIEF SUMMARY

A variety of optoelectronic, semiconductor microelectronics and other applications can benefit from the development of efficient structures and methods for forming arrays of nanowires with a period of 150 nm or less, which are registered laterally to the surface of a topographic feature that may be formed using lithography. To manufacture such structures one embodiment employs a hard nanomask formed by irradiating a layer of a first material with an ion flow. The hard nanomask is intended for use in transferring a substantially periodic pattern onto a thin film. This nanomask includes a substantially periodic array of substantially parallel, elongated elements formed on the surface of the first layer and having a wavelike cross-section and being oriented along a first direction. At least some of the elements having the following structure in cross-section: an inner region of the first material, and a first outer region of a second material covering a first portion of the inner region, wherein the second material is formed by modifying the first material using an ion flow. The substantially parallel, elongated elements have the wavelike cross-section are positioned on the topographic feature between two opposing sidewalls of the topographic feature with the sidewalls of the topographic feature are oriented substantially parallel along the first direction. In at least some embodiments the periodic array includes N elongated elements where N is a positive integer. In at least some embodiments N is 2, 3, 4, 5, 6, 7 or 8.

Another embodiment is a method of forming a hard nanomask for transferring a substantially periodic pattern into a thin film including forming a first layer of a first material; forming a topographic feature in a surface of the first layer, where the topographic feature is defined by two opposing sidewalls, where the sidewalls are oriented substantially parallel along a first direction; and irradiating the surface of the topographic feature with a flow of ions directed alternatively towards the opposite sidewalls of the topographic feature to form a hard nanomask, the nanomask including a substantially periodic array of substantially parallel elongated elements having a wavelike cross-section and being oriented substantially parallel along the first direction, at least some of the elements having the following structure in cross-section: an inner region of first material, a first outer region of a second material covering a first portion of the inner region, and a second outer region of the second material covering a second portion of the inner region and connecting with the first outer region at a wave crest, where the first outer region is substantially thicker than the second outer region, and where the second material is formed by modifying the first material by the ion flow, where a plane of incidence of the ion flow is substantially perpendicular to the first direction and where the substantially parallel, elongated elements having the wavelike cross-section are positioned on the surface of the topographic feature between the two opposing sidewalls defining the topographic feature.

In at least some embodiments, forming the topographic feature includes depositing a second layer of a first material to compensate for narrowing of the topographic feature by ion sputtering during irradiating the surface of the topographic feature by the flow of ions. In at least some other embodiments, the periodic array includes N elongated elements where N is a positive integer. In at least some embodiments N is 2, 3, 4, 5, 6, 7 or 8.

DETAILED DESCRIPTION

Figure 1A:
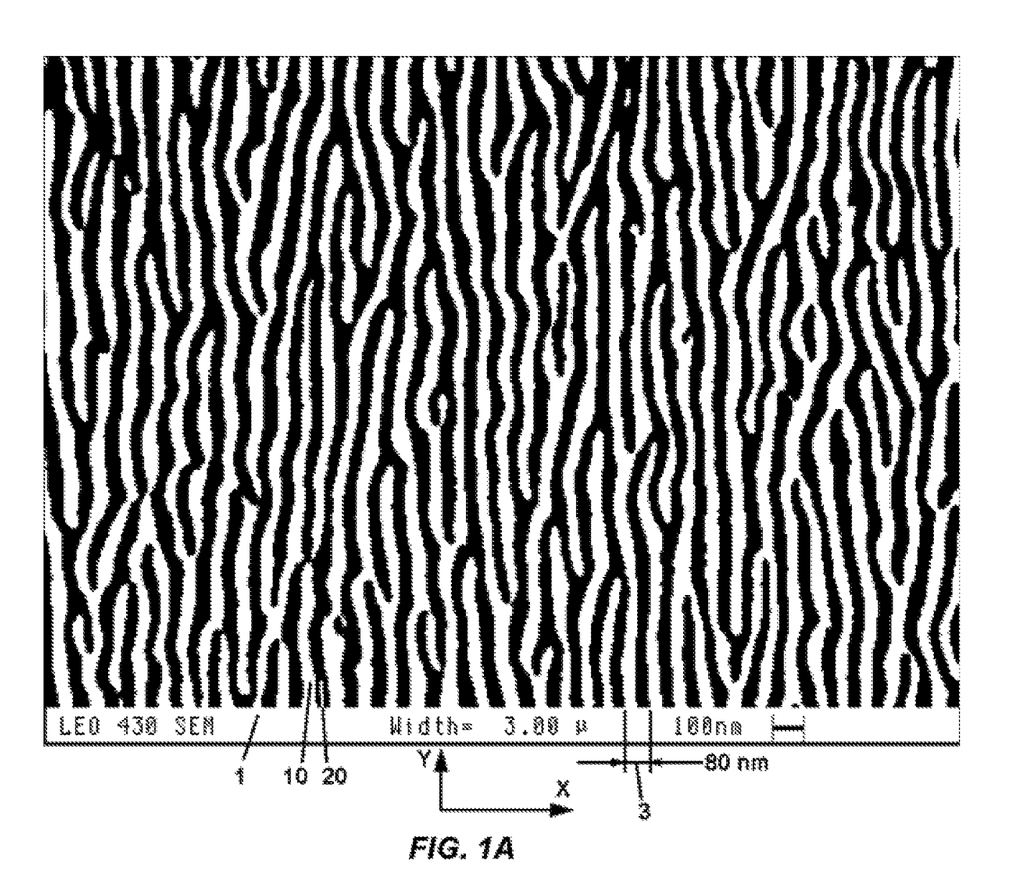
FIG. 1A shows a SEM top view image of a conventional WOS hard nanomask having a period of about 80 nm formed by single-step irradiation of amorphous silicon layer with N2+ ions having energy E=5 keV at the angle of bombardment θ=53° from surface normal.
Figure 1B:
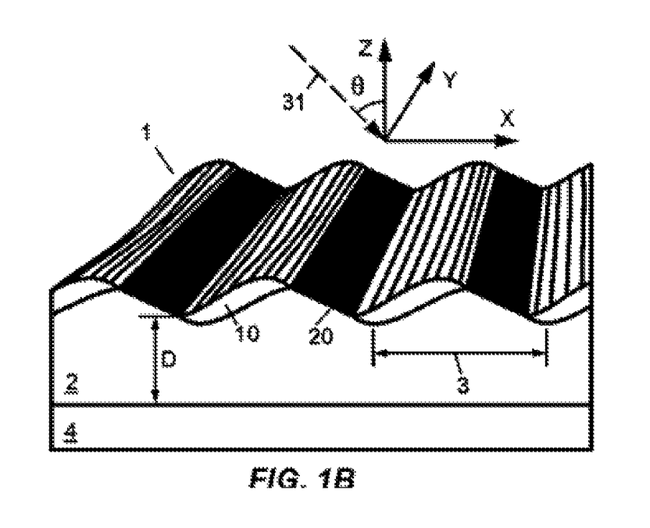
FIG. 1B is a perspective view of elongated ridge elements of a conventional WOS hard nanomask and their wavelike cross-section.

One example of a method for nanorelief formation on a film surface, utilizing plasma modification of a wave-ordered structure (WOS) formed on an amorphous silicon layer is schematically illustrated in FIGS. 1A and 1B. First, a layer of amorphous silicon 2 is deposited on top of the target thin film layer 4. Then, the silicon layer is sputtered with a flow of nitrogen ions 31 to create a conventional wave ordered nanostructure 1. The resultant wave-ordered nanostructure has relatively thick (for example, 2-15 nm) regions of amorphous silicon nitride 10 and relatively thin (for example, 0.2-1.5 nm) regions of amorphous silicon nitride 20 situated respectively on the front and back sides of the waves 9 (ridge elements) in the wave-ordered structure 1. As shown, the wave troughs are spaced from the surface of the film layer 4 by a distance D that is usually less than the nanostructure period 3. After the wave-ordered nanostructure 1 is formed, its planar pattern, which is shown in FIG. 1A, is transferred into the underlying film layer 4 by selectively etching the amorphous silicon layer 2 while using regions 10 and 20 as a nanomask. See, also, Russian Patent Application RU 2204179, incorporated herein by reference. Other examples of forming a coherent hard nanomask and methods of its formation are described in U.S. Pat. No. 7,768,018 and U.S. Patent Application Publication No. 2006/0273067 and methods of formation of coherent wavy nanostructures are disclosed in U.S. Pat. No. 7,977,252 and U.S. Patent Application Publication No. 2008/0119034, all of which are incorporated herein by reference. PCT Patent Application PCT/RU2013/000192, incorporated herein by reference, discloses a polarizer based on a nanowire grid.

Figure 2A:
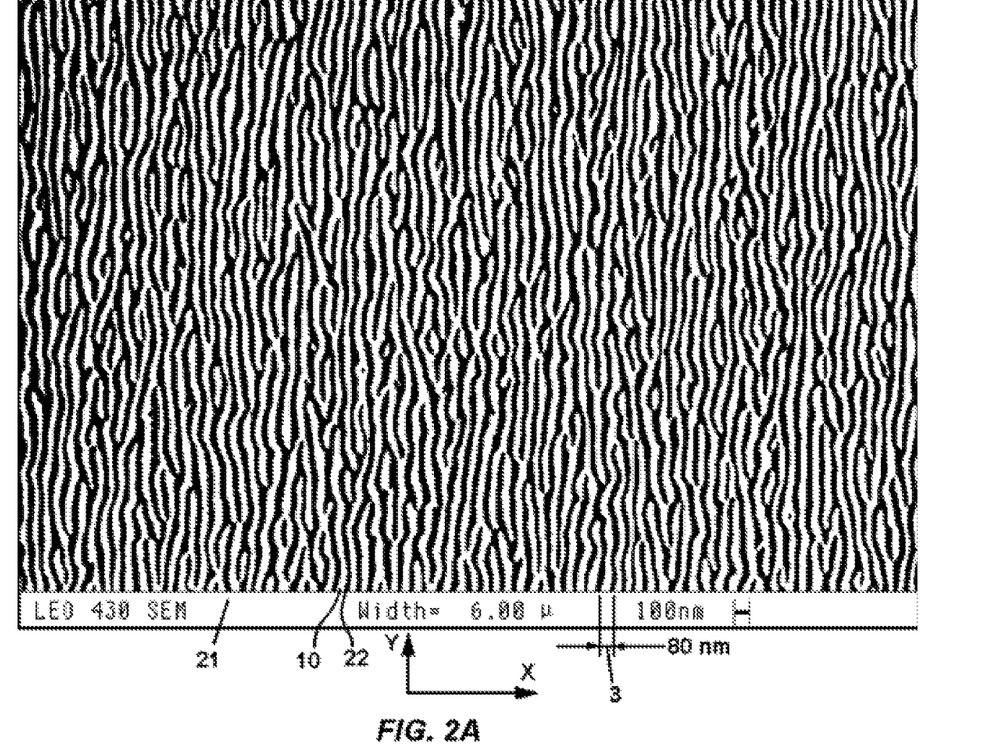
FIG. 2A shows a SEM top view image of one embodiment of an anisotropic array of elongated ridge elements formed in amorphous silicon layer from a conventional WOS hard nanomask by wet etching.
Figure 2B:
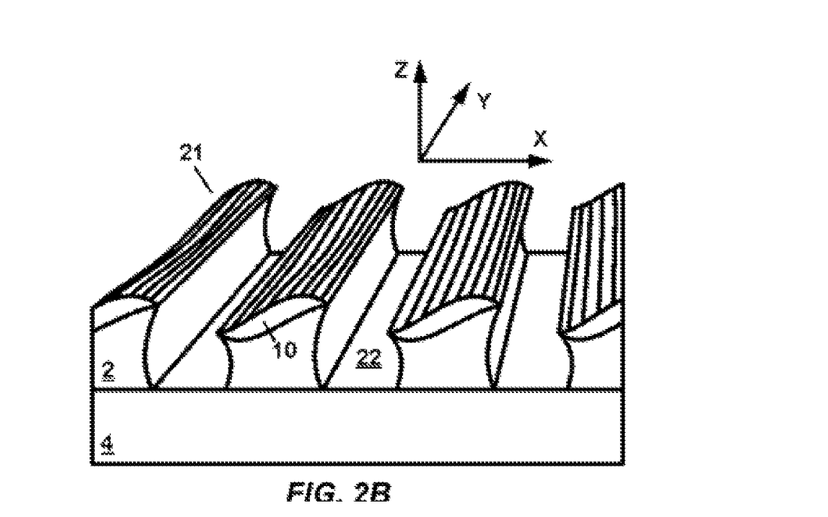
FIG. 2B is a perspective view of elongated ridge elements formed in amorphous silicon layer from a conventional WOS hard nanomask by wet etching.

However, experiments using conventional wave ordered nanostructures obtained by single-step oblique sputtering of amorphous silicon with nitrogen ions showed that these structures often do not possess a desired degree of ordering (i.e., high coherency). FIGS. 2A and 2B show an array of nanostructures 21 manufactured by this technique. The array is composed from amorphous silicon nanostripes 2 covered by the regions of amorphous silicon nitride 10. The nanostripes 2 (ridge elements) are separated by trenches 22. FIG. 2A shows that even in a relatively small area this array has a significant number of defects: bends, connections, and breaks. In at least some instances, the array may not be sufficiently coherent enough for optoelectronic applications. In at least some instances, the array may not be registered or aligned laterally to the surface of the target thin film layer 4, which may be useful for semiconductor microelectronics applications.

To improve the pattern quality the self-formation process is performed on the surfaces of lithographically defined topographic features. Experiments on forming a wave-ordered structure (WOS) on surfaces of topographic features with parallel opposite sidewalls oriented in a first direction show that such WOS patterns often possess a considerably higher degree of ordering (i.e., coherency or straightness of elongated elements of WOS) compared to conventional WOS patterns. In at least some embodiments, this is particularly observed when, during WOS formation, the ion incidence plane is positioned substantially perpendicular to the first direction, the ion irradiation is performed alternatively in stepwise manner when the ion beam is directed towards the one sidewall of the feature then towards the opposite sidewall and so on, and the feature dimension between the sidewalls is close to an integer multiple of the WOS period.

Such topographic features can be fabricated by, for example, optical lithography on the surface of different materials including, for example, monocrystalline silicon, amorphous silicon, silicon oxide, gallium arsenide, epitaxial gallium arsenide, gallium aluminum arsenide, epitaxial gallium aluminum arsenide, germanium, or silicon-germanium, or other semiconductor materials and the like.

Figure 3A:
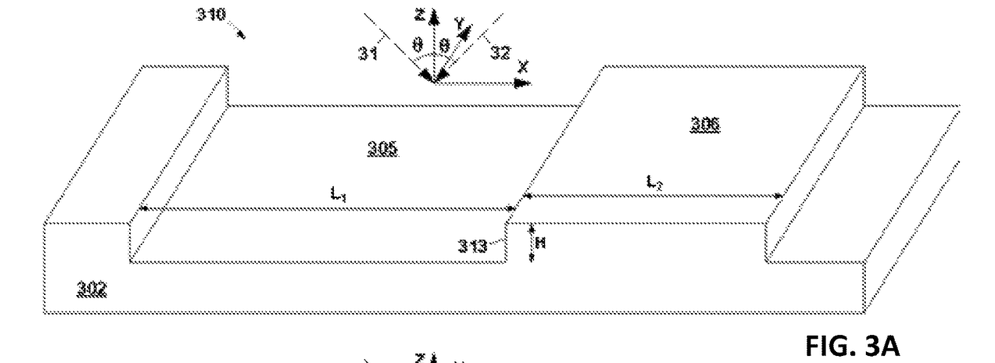
FIG. 3A is a perspective views of topographic features on a semiconductor surface before ion irradiation, according to the invention.

FIG. 3A illustrates one embodiment of a structure 310 including periodic topographic features 305, 306 on a surface of monocrystalline silicon 302. The vertical sidewalls 313 of the features 305, 306 are positioned parallel along the Y-axis. In one example of the illustrated embodiment, the width of the recessed feature 305 L1 is 710 nm; the width of the raised feature 306 L2 is 490 nm; and the height of the sidewalls H is 74 nm. In at least some embodiments, the sidewall height is in the range from about 20 to about 100 nm and the sidewall may be tilted up to about 45° from vertical orientation. In at least some embodiments, the feature width may be equal to the integer multiple N of the hard nanomask period $\lambda$ plus some overhead, which may be from about $0.5\lambda$ to about $3.5\lambda$; and the total feature width may be in the range from about $(N+0.5)\lambda$ to about $(N+3.5)\lambda$. N can be, for example, 1, 2, 3, 4, 5, 6, 7, 8, 9, or 10 or more. In the example of the illustrated embodiment, for the recessed feature 305 $\lambda=86$ nm, N=5 and for the raised feature 306 $\lambda=86$ nm, N=4.

The structure 310 was irradiated by a $N_2^+$ ion beam at an ion energy of 5 keV in the ion incidence plane ZX (the plane which is defined by a normal to the surface of the material, i.e. Z axis, and a vector oriented in the direction of the ion flow, 31 or 32). The ion irradiation was performed alternatively in stepwise manner. First, the ion beam was directed along 32 at $\theta=43°$, then it was directed along 31 at the same angle $\theta$ and so on. The total number of alternating steps of irradiation was 58 with 5 seconds for each step. In at least some embodiments, the ion beam energy may range from about 1 to about 10 keV and the ion incidence angle $\theta$ may range from about 40° to about 55°. In at least some other embodiments, the ion beam energy may range from about 1 to about 5 keV and the angle $\theta$ may range from 41° to about 55°.

Figure 3B:
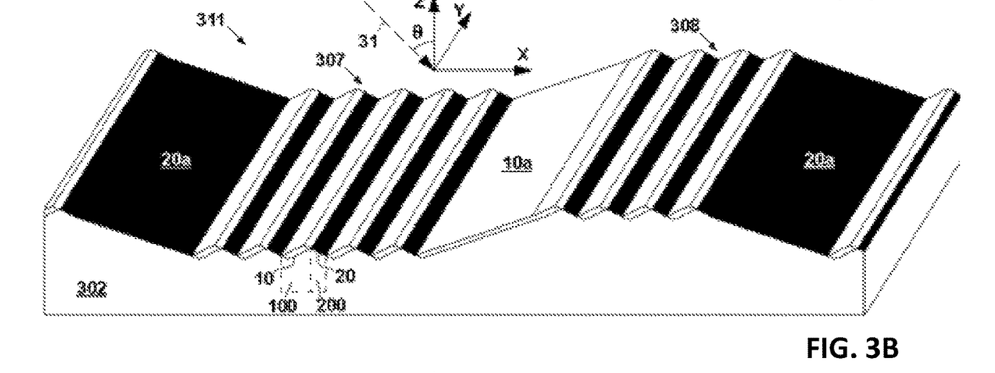
FIG. 3B is a perspective view of the semiconductor of FIG. 3A after ion irradiation resulting in the formation of the wavelike hard nanomasks including 4 and 5 elongated ridge elements, according to the invention.
Figure 3C:
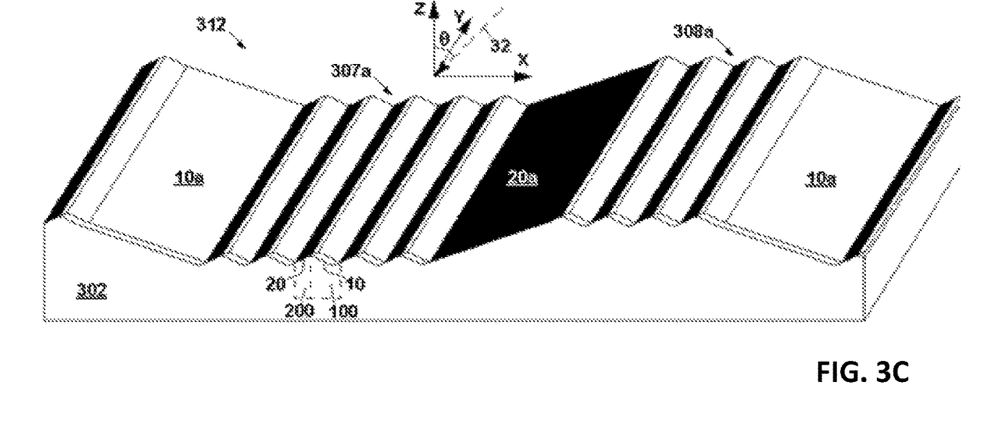
FIG. 3C is a perspective view of the semiconductor of FIG. 3A after ion irradiation at an angle different from that used to obtain the structure of FIG. 3B and resulting in the formation of the wavelike hard nanomasks including 4 and 5 elongated ridge elements, according to the invention.

The resultant structure 311 is illustrated in FIG. 3B with region 307 of hard nanomask of five parallel elements (waves) and region 308 of 4 parallel elements (waves) oriented along the Y-axis direction. The nanomask period is 86 nm. Each element has relatively thick 4-15 nm silicon nitride regions 10 and relatively thin 0.2-1.5 nm silicon nitride regions 20 on the opposite slopes of the waves. Regions 10 cover the inner area 100 and regions 20 cover the inner area 200 of silicon. The nanomasks 307 and 308 are spaced by tilted sidewalls 10a and 20a, which are relatively thick silicon nitride regions and relatively thin silicon nitride regions, respectively. The tilted sidewalls 10a and 20a resulted from ion beam sputtering of the structure 310. The orientation of thick silicon nitride regions 10 and thin silicon nitride regions 20 is determined by the final ion beam irradiation step. For example, if at the final step of ion irradiation the ion beam is directed along the arrow 32 as shown for structure 312 in FIG. 3C the orientation of the nanomask regions 10 and 20 became opposite to that for the structure 311 of FIG. 3B, where the ion beam is directed along the arrow 31. Since the thickness of the silicon nitride on the front side (regions 10) is much larger then on the back side (regions 20) and since the silicon nitride is hard and durable, this nanomask is particularly suited for transferring patterns into the underlying layers using anisotropic etching techniques.

Figure 4A:
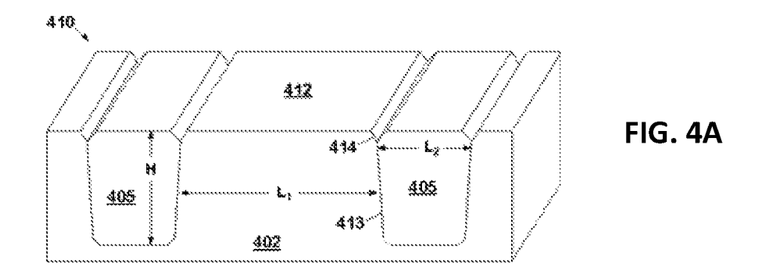
FIG. 4A is a perspective views of topographic features on a semiconductor surface before ion irradiation, according to the invention.

FIG. 4A illustrates a structure 410 including periodic topographic features 412, 405 on the surface of monocrystalline silicon 402 of another embodiment. The sidewalls 413 of the features are positioned parallel along the first direction. As an example, the width of the feature 412 L1 is 675 nm; the width of the trench 405 filled with TEOS (tetraethyl orthosilicate) L2 is 250 nm; and the height of the sidewalls 413 is about 370 nm. At the top of the feature 412 there are chamfers 414. In at least some embodiments, the height of the sidewalls 413 is in the range from about 100 to about 500 nm and the width of the feature 412 positioned between filled trenches 405 may be equal to the integer multiple N of the hard nanomask period k plus some overhead, which may be from about $0.2\lambda$ to about $1.5\lambda$; and the total feature width may be in the range from about $(N+0.2)\lambda$ to about $(N+1.5)\lambda$. N can be, for example, 1, 2, 3, 4, 5, 6, 7, 8, 9, 10, or more. In the example of the illustrated embodiment, for the features 412 of FIG. 4A $\lambda=95$ nm, N=6. In at least some embodiments, the chamfers 414 may be tilted from about 10° to about 60° from vertical orientation. In at least some embodiments, the sidewalls 413 of the feature 412 positioned between filled trenches 405 may be tilted from about 5° to about 15° from vertical orientation. In some other embodiments, the sidewalls 413 may be tilted to about 5° from vertical orientation or may be oriented strictly vertical.

The structure 410 was irradiated by $N_2^+$ ion beam at the ion energy of about 5 keV in the ion incidence plane perpendicular to the first direction. The ion irradiation was performed in stepwise manner when the ion beam was directed alternatively towards the opposite sides 413 of the feature 412. The angle of ion incidence $\theta=42°$. The total number of alternating steps of irradiation was 10 with 6 minutes for each step.

Figure 4B:
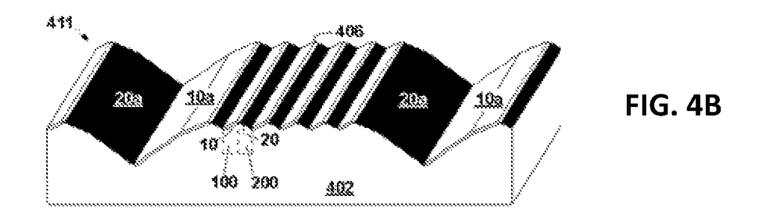
FIG. 4B is a perspective view of the semiconductor of FIG. 4A after ion irradiation resulting in the formation of the wavelike hard nanomasks including 6 elongated ridge elements, according to the invention.

The resultant structure 411, illustrated in FIG. 4B, includes region 406 of hard nanomasks with 6 parallel elements (waves) oriented along the first direction. The nanomask period is 95 nm. Each element has thick silicon nitride regions 10 and thin silicon nitride regions 20 on the opposite slopes of the waves. Regions 10 cover the inner area 100 and regions 20 cover the inner area 200 of silicon. The nanomasks 406 are spaced by tilted sidewalls 10a and 20a, which are thick silicon nitride regions and thin silicon nitride regions, accordingly. The tilted sidewalls 10a and 20a were resulted from ion beam sputtering of the structure 410.

Figure 4C:
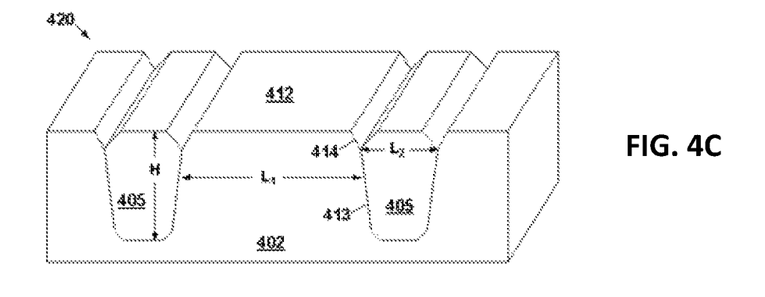
FIG. 4C is a perspective views of topographic features on a semiconductor surface before ion irradiation, according to the invention.

FIG. 4C illustrates a structure 420 including periodic topographic features 412, 405 on the surface of monocrystalline silicon 402 of a further embodiment. The sidewalls 413 of the features are positioned parallel along the first direction. As an example, the width of the feature 412 L1 is 385 nm; the width of the trench 405 filled with TEOS L2 is 160 nm; and the height of the sidewalls 413 is about 350 nm. At the top of the feature 412 there are chamfers 414.

The structure 420 was irradiated by $N_2^+$ ion beam at the ion energy of about 3 keV in the ion incidence plane perpendicular to the first direction. The ion irradiation was performed in stepwise manner when the ion beam was directed alternatively towards the opposite sides 413 of the feature 412. The angle of ion incidence $\theta=43°$. The total number of alternating steps of irradiation was 14 with about 6 minutes for each step.

Figure 4D:
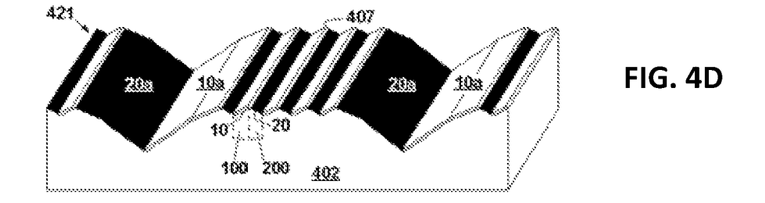
FIG. 4D is a perspective view of the semiconductor of FIG. 4C after ion irradiation resulting in the formation of the wavelike hard nanomasks including 5 elongated ridge elements, according to the invention.

The resultant structure 421, illustrated in FIG. 4D, includes region 407 of hard nanomasks with 5 parallel elements (waves) oriented along the first direction. The nanomask period is 64 nm. Each element has thick silicon nitride regions 10 and thin silicon nitride regions 20 on the opposite slopes of the waves. Regions 10 cover the inner area 100 and regions 20 cover the inner area 200 of silicon. The nanomasks 407 are spaced by tilted sidewalls 10a and 20a, which are thick silicon nitride regions and thin silicon nitride regions, accordingly. The tilted sidewalls 10a and 20a resulted from ion beam sputtering of the structure 420.

Figure 4E:
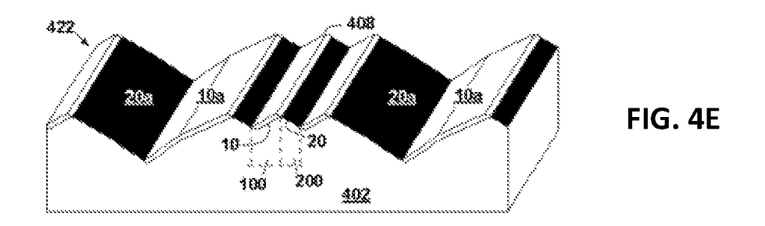
FIG. 4E is a perspective view of the semiconductor of FIG. 4C after ion irradiation resulting in the formation of the wavelike hard nanomasks including 3 elongated ridge elements, according to the invention.

If, instead, the structure 420 is irradiated by 5.5-keV $N_2^+$ ion beam with 4-minutes irradiation steps and all other parameters being the same the resultant nanomasks 408 include by 3 waves as shown in structure 422 of FIG. 4E. The nanomask period is 98 nm.

Figure 5A:
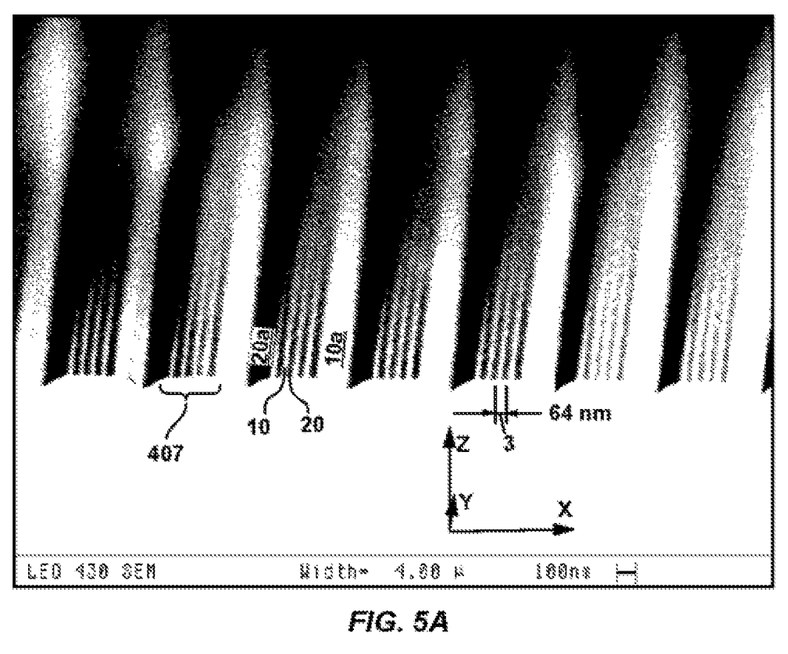
FIG. 5A shows a SEM cross-section view, angled at 82°, of a plurality of wavelike hard nanomasks including 5 elongated ridge elements, according to the invention.
Figure 5B:
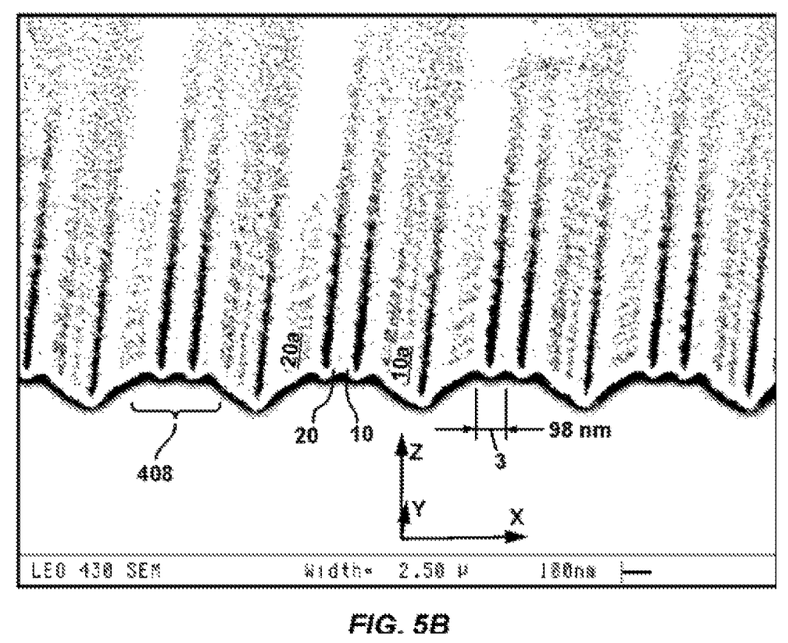
FIG. 5B shows a SEM cross-section view, angled at 82°, of a plurality of wavelike hard nanomasks including 3 elongated ridge elements, according to the invention.

FIGS. 5A and 5B show SEM images of the nanomasks 407 and 408 of FIG. 4D, respectively. Both images represent clefts of samples with the nanomasks viewed at 8° to the nanomask surface plane (XY). Such a grazing angle is effective to reveal the straightness of the nanomask elements. One can see that the nanomask elements are straight parallel lines oriented along Y-axis when viewed at grazing angle of 8° to that axis.

Figure 6A:
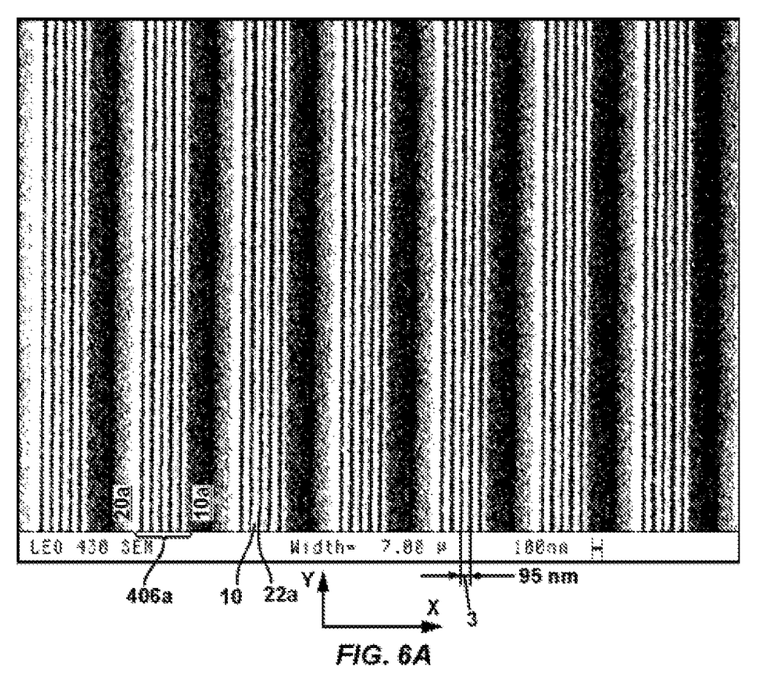
FIG. 6A shows a SEM top view image of a plurality of wet etched wavelike hard nanomasks including 6 elongated ridge elements, according to the invention.
Figure 6B:
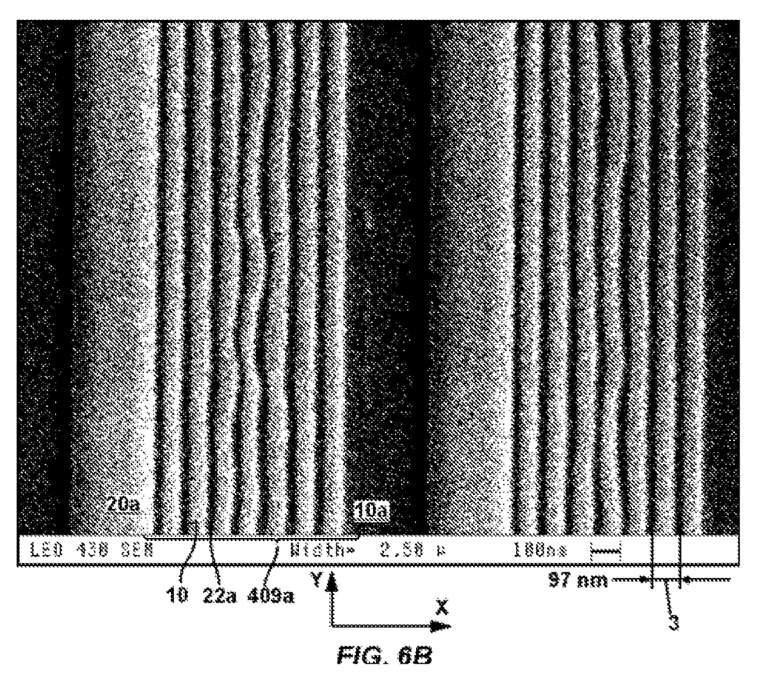
FIG. 6B shows a SEM top view image of wet etched wavelike hard nanomasks including 8 elongated ridge elements, according to the invention.

FIGS. 6A and 6B show SEM top view images of wet etched nanomasks 406a and 409a including 6 and 8 elements, respectively. The wet etched nanomasks contain silicon nitride regions 10 and trenches 22a between them. Each nanomask is positioned on top surface of topographic silicon features between sloped parallel sidewalls 10a and 20a oriented along Y-axis direction. The nanomasks were wet etched for approximately 16 seconds in a solution (65% HNO3):(49% HF)=250:1 v/v. One can see that in case of the 8-element nanomask in FIG. 6B middle lines exhibit some waviness.

Figure 6C:
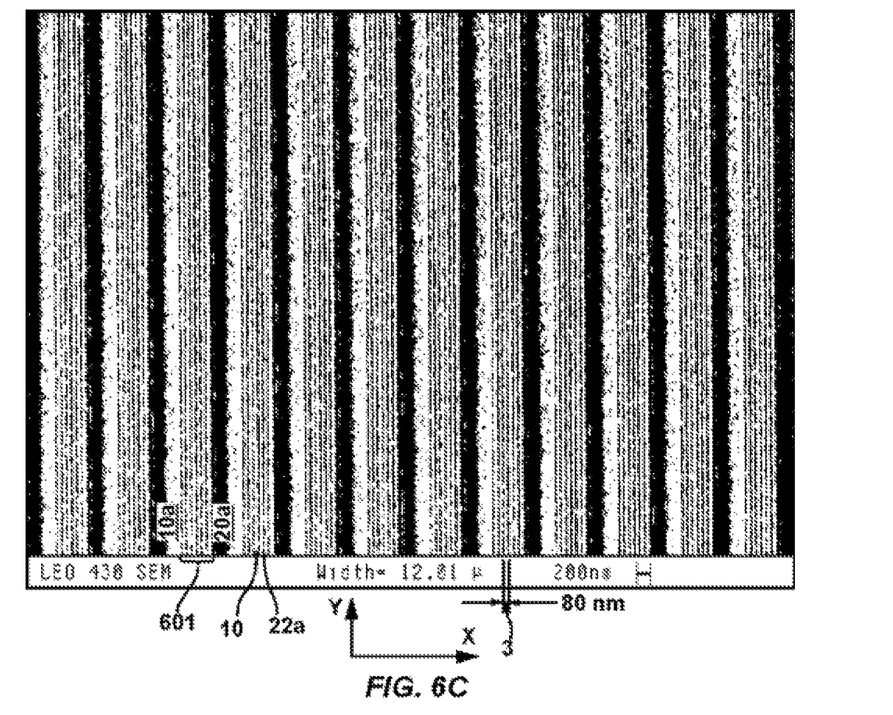
FIG. 6C shows a SEM top view image of a plurality of wet etched wavelike hard nanomasks including 7 elongated ridge elements, according to the invention.
Figure 6D:
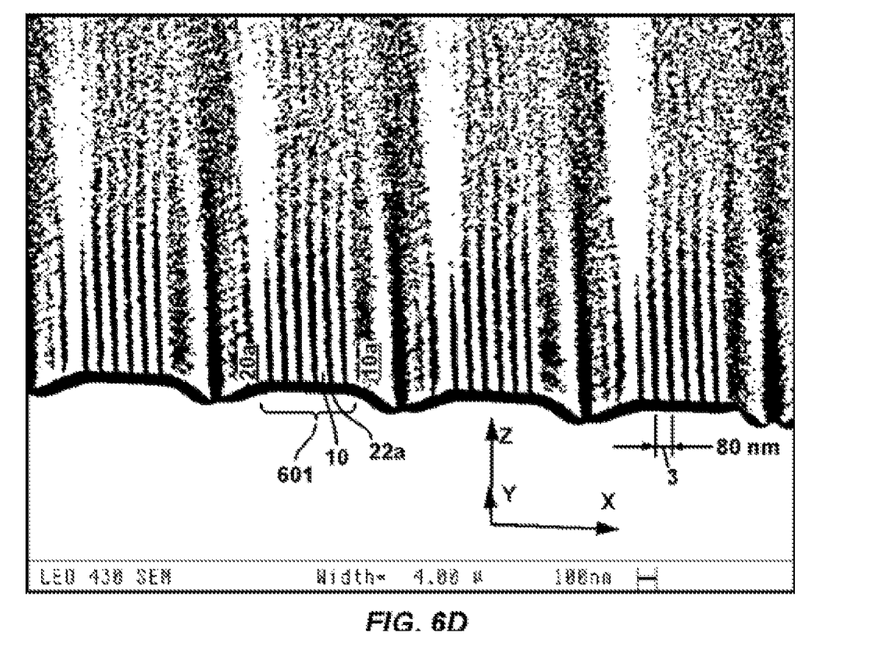
FIG. 6D shows a SEM cross-section view, angled at 82°, of wet etched wavelike hard nanomasks including 7 elongated ridge elements, according to the invention.

FIGS. 6C and 6D show a top view and a cross-section view, angled at 82°, of SEM images of a plurality of wet etched hard nanomasks 601 including 7 elongated ridge elements. The hard nanomask 601 is formed by N2+ ion beam at ion beam energy of 4.2 keV and θ=42° for 12 alternating steps of ion bombardment. The nanomask elements are straight parallel lines oriented along Y-axis when viewed at grazing angle of 8° to that axis.

Figure 7A:
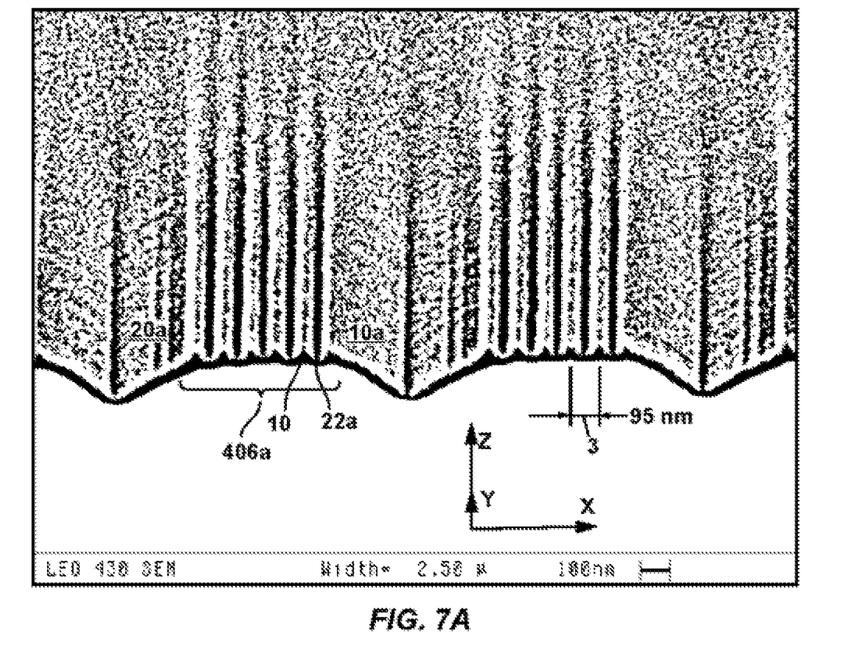
FIG. 7A shows a SEM cross-section view, angled at 82°, of wet etched wavelike hard nanomasks including 6 elongated ridge elements, according to the invention.

FIG. 7A demonstrates the cleavage of a 6-element nanomask 406a viewed at 8° to the direction of their elongated elements (Y-axis), the top view of which is presented in FIG. 6A. The nanomask is positioned on top surface of topographic silicon features between sloped parallel sidewalls 10a and 20a oriented along Y-axis direction. One can see that the nanomask elements are straight parallel lines oriented along Y-axis when viewed at grazing angle of 8° to that axis.

Figure 7B:
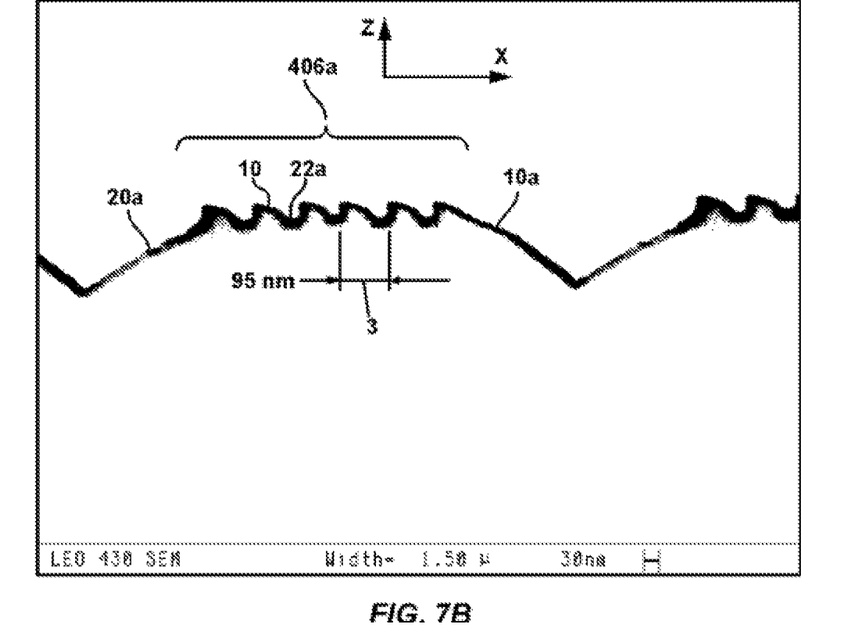
FIG. 7B shows a SEM cross-section view, angled at 90°, of wet etched wavelike hard nanomask including 6 elongated ridge elements, according to the invention.

FIG. 7B demonstrates the magnified view of the cleavage of a 6-element nanomask 406a viewed along the direction of their elongated elements (Y-axis), the top and angled views of which are shown in FIGS. 6A and 7A, respectively. One can see the silicon nitride regions 10 and 10a resistant to wet etching in a solution (65% HNO3):(49% HF)=250:1 v/v, etched trenches 22a between them, and etched regions 20a on the topographic feature sidewalls.

Figure 8A:
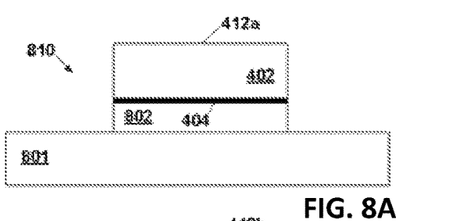
FIGS. 8A to 8J schematically illustrates steps in one embodiment of a method for forming an array of monocrystalline silicon nanowires using a wavelike hard nanomask on the surface of a topographic feature, according to the invention.

FIGS. 8A-8J illustrate one embodiment of a method for manufacturing a dense array of monocrystalline silicon nanowires 819 (FIG. 8J) on the surface of buried oxide (BOX) layer 801 of a SOI (silicon on insulator) wafer. FIG. 8A shows a structure 810, including a BOX layer 801 and an initial topographic feature 412a including layers of monocrystalline silicon 802 (for example, approximately 90 nm thick), silicon oxide 404 (for example, approximately 20 nm thick), and amorphous silicon 402 (for example, approximately 300-350 nm thick). The topographic feature 412a can be made using, for example, lithographic patterning and etching to form layers 402, 404, and 802.

Figure 8B:
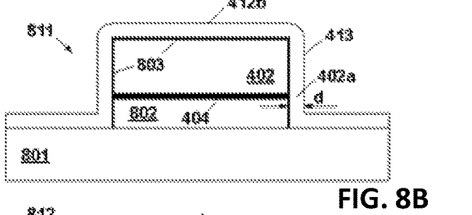

In one embodiment, to register or align the nanomask 406 relative to the surface of target layers 404 and 802 within a topographic feature 415 in X-axis direction one can deposit a layer 402a of amorphous silicon (for example, approximately d=50 nm thick) on the topographic feature 412 covered by a thin silicon oxide layer 803 (for example, approximately 5 nm thick) as shown in structure 811 in FIG. 8B. The topographic feature 412b with sidewalls 413 has a larger width by approximately 2d+10 nm to align the nanomask 406 (FIG. 8E) relative to the surface of target layers 404 and 802.

The amorphous silicon layers 402 and 402a may be deposited, for example, by magnetron sputtering of a silicon target, by silicon target evaporation with an electron beam in high vacuum, or by any other method known in art.

Figure 8C:
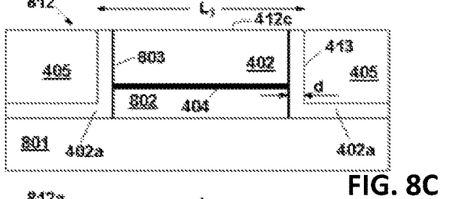

In one embodiment, the initial structure 812, as illustrated in FIG. 8C, may include material 405 (for example, TEOS, silicon oxide or silicon nitride), the surface of which is leveled with the surface of amorphous silicon 402 and 402a using, for example, chemical mechanical planarization. Hereafter, silicon oxide or TEOS is deemed as material 405. In this case, the topographic feature 412c having width L3 is similar to the topographic feature 412 of FIGS. 4A and 4C.

Figure 8D:
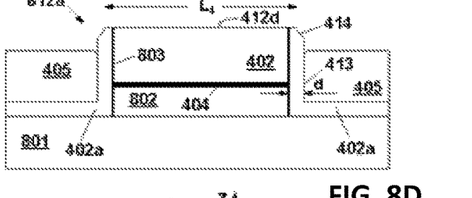

Selective etching of the structure 812 may result in the structure 812a of FIG. 8D, where the raised topographic feature 412d has the chamfers 414 narrowing the top surface of the feature to the dimension L4<L3. Note that chamfers 414 often result in lowering ion sputtering on their surfaces and accelerating the nanomask formation on top surface of the topographic feature.

Figure 8E:
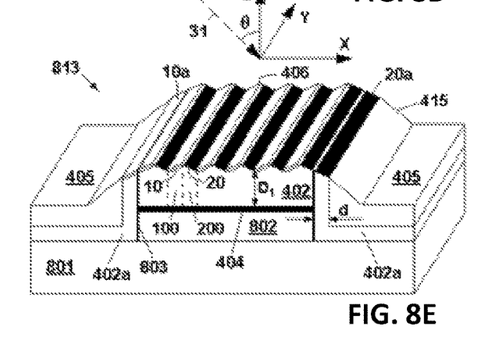
Figure 8F:
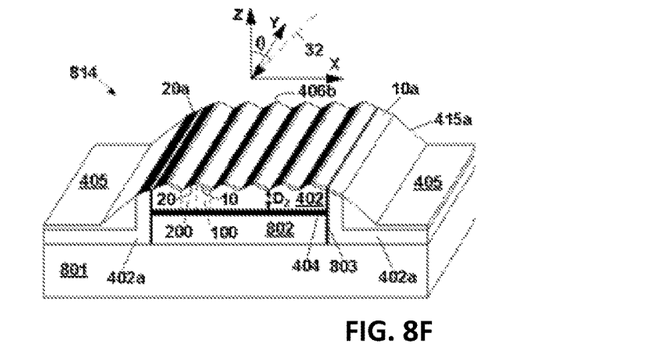

To form hard nanomasks 406 and 406b shown in structures 813 and 814 of FIGS. 8E and 8F, respectively, the structure 812 or 812a may be irradiated with nitrogen $N_2^+$ ions in alternating stepwise mode when the ion beam is directed alternatively along the vectors 31 and 32 in the ion incidence pane ZX. The thickness of the layer 402 is selected to enable the formation of the nanomask with desired period, λ, (for example, a period of approximately 40-100 nm) positioned at desired distance D1 or D2<D1 from the target layer 404. During ion irradiation the materials 402, 402a, 405, and 803 are sputtered out and the distance between the nanomask and the target layer decreases. The elongated elements of the nanomasks 406 and 406b including outer regions of silicon nitride 10 and 20 and inner regions of silicon 100 and 200 covered by outer regions are parallel to the first direction (Y-axis) together with the sidewalls of the topographic features 415 and 415a and perpendicular to the ion incidence plane XZ.

In some embodiment, the nanomask is positioned symmetrically with respect to the sidewalls of the topographic feature. In other embodiments, the nanomask is positioned asymmetrically with respect to the sidewalls of the topographic feature. It depends on the number of steps of ion irradiation. The larger the latter, the greater is the symmetry of the nanomask position with respect to the sidewalls of the topographic feature. In any case the nanomask can be registered or aligned to the sidewalls of the topographic feature.

Figure 8G:
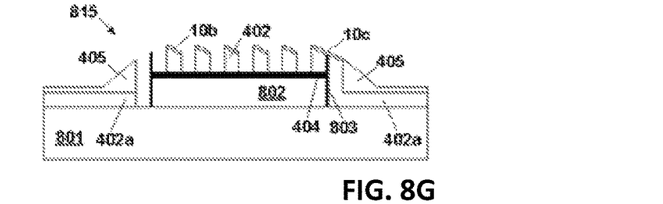

Turning to FIG. 8F, after the nanomask 406b is formed, the structure 814 is modified by applying a reactive-ion plasma ($Cl_2$, $Cl_2$—Ar, HBr—$O_2$ or $Cl_2$—He—$O_2$ or by any other method known in art) to the amorphous silicon layer 402, using the nanomask 406b. In at least some embodiments, the reactive-ion etching (ME) results in a modified nanomask having silicon nitride regions 10b formed on top of 40-100 nm high stripes of amorphous silicon 402, as shown in the structure 815 of FIG. 8G. The sidewall of the topographic feature 10a is transformed by RIE into the sidewall 10c. The thickness of regions 10b and 10c may become thinner than the thickness of original regions 10 and 10a during plasma etching, and region 20a may be etched out with the underlying silicon.

Depending on the chosen thickness of the regions 20 of the nanomask, a preliminary breakthrough etching step might be performed using argon ion sputtering or sputtering by ions of etching plasma for a relatively short period of time to remove regions 20 from the nanomask. To remove regions 20 one can also perform wet etching in HNO3-HF solution for a short period of time.

Figure 8H:
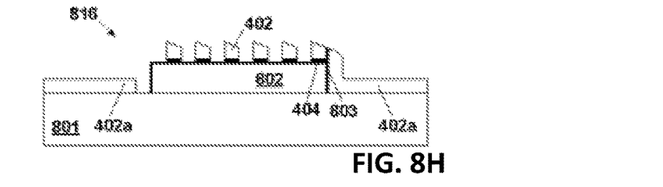
Figure 8I:
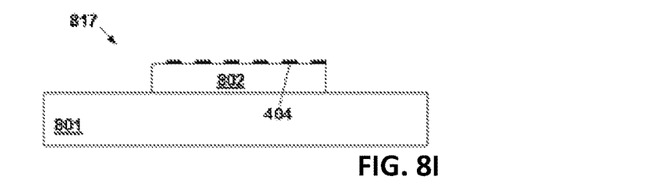
Figure 8J:
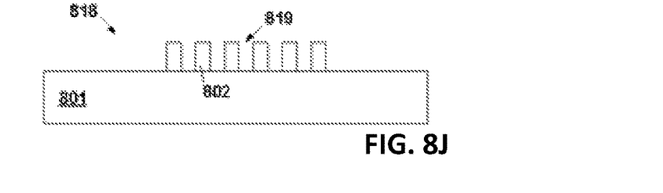

In at least some embodiments, a 20-nm-thick target layer of silicon oxide 404 can be partially etched, for example, in $CF_4$—$H_2$, $CHF_3$, $C_4F_6$—Ar or $C_4F_8$—Ar based plasma using amorphous silicon as a mask as shown in structure 816 of FIG. 8H. Then the layer 402a can be burned out in $SF_6$ based plasma and the target silicon oxide layer 404 can be etched to silicon layer 802 to form the structure 817 of FIG. 8I. The patterned target layer 404 is then used as a nanomask for etching a layer of monocrystalline silicon 802 by applying a reactive-ion plasma ($Cl_2$, $Cl_2$—Ar, HBr—$O_2$ or $Cl_2$—He—$O_2$ or by any other method known in art). After plasma etching the damaged silicon layer may be removed through oxidation followed by oxide removal. The final structure 818, illustrated in FIG. 8J, contains a dense array 819 of monocrystalline silicon nanowires 802 on the surface of BOX layer 801 of a SOI wafer. The array 819 can be used for manufacturing multiwire-channel field effect transistors.

In at least some embodiments, different ion species can be used along with $N_2^+$ ions to form the WOS and to generate the hard wavelike nanomask. For example, N+, $NO^+$, $NH_m^+$, $O_2^+$, $Ar^+$, $Kr^+$, $Xe^+$, or a mixture of $Ar^+$ and $N_2^+$ can be used.

In at least some embodiments, before the nanomask formation the topographic features are subjected to ion bombardment under conditions that the nanomask is not formed, for example at $\theta=37°$ and ion energy of about 5 keV for $N_2^+$ ion beam. The ion bombardment may be performed in multistep manner similarly to the alternating bombardment of the topographic feature during nanomask formation. In some embodiments, this preliminary bombardment results in the formation of chamfers 414 shown in FIGS. 4A, 4C, and 8D that may lower ion sputtering on their surfaces and may accelerate the nanomask formation on top surface of the topographic feature.

In at least some embodiments, the composition of regions 10 and 20 of the WOS formed by a first ion irradiation of a material with the first ions can be changed by a second ion irradiation during a short period of time, if the ion incidence planes for the first and the second ion irradiations substantially coincide. For example, a WOS on silicon having regions 10 and 20 of silicon oxide formed from silicon by oxygen ions can be transformed by nitrogen ion flow into a WOS on silicon having regions 10 and 20 of silicon nitride. The sputtering depth for such a transformation may be approximately equal to the thickness of the relatively thick regions 10. Alternatively, a WOS on silicon having regions 10 and 20 of silicon nitride formed from silicon by nitrogen ions can be transformed by oxygen ion flow into a WOS on silicon having regions 10 and 20 of silicon oxide.

While the described above preferred embodiments illustrate the formation of the nanomask by the modification of monocrystalline silicon or an amorphous silicon layer by oblique sputtering with nitrogen ions, similar results can be obtained using different materials (for example, nanocrystalline silicon, polycrystalline silicon, crystalline gallium arsenide, germanium, silicon-germanium, etc.) and different ions (for example, $N_2^+$, $N^+$, $NO^+$, $NH_m^+$, $O_2^+$, $Ar^+$, $Kr^+$, $Xe^+$, or a mixture of $Ar^+$ and $N_2^+$).

The invention can be used, for example, for forming nanowire arrays for nanoelectronics and optoelectronics devices.

What is claimed as new and desired to be protected is:

1. A method of forming a hard nanomask for transferring a substantially periodic pattern into a thin film, the method comprising:
   forming a first layer of a first material;
   forming a topographic feature in a surface of the first layer, wherein the topographic feature is defined by two opposing sidewalls, wherein the two opposing sidewalls are oriented substantially parallel along a first direction; and
   irradiating the surface of the first layer with a flow of ions in a plurality of irradiation steps alternating between being directed towards a first one of the two opposing sidewalls of the topographic feature and a second one of the two opposing sidewall of the topographic feature to form a hard nanomask, the hard nanomask comprising a plurality of first regions, wherein each of the first regions comprises a substantially periodic array of substantially parallel elongated elements having a wavelike cross-section and being oriented substantially parallel along the first direction, at least some of the substantially parallel elongated elements having the following structure in cross-section: an inner region of the first material, and an outer region defining opposing nanomask sidewalls and formed of a second material covering portions of the inner region wherein the second material is formed by modifying the first material by the flow of ions, wherein a plane of incidence of the flow of ions is substantially perpendicular to the first direction and wherein the substantially parallel, elongated elements having the wavelike cross-section are positioned on a surface of the topographic feature between the two opposing sidewalls defined by the topographic feature.

2. The method of claim 1, wherein a wavelength of the substantially periodic array is in a range from 20 to 150 nm.

3. The method of claim 1, wherein the first material is silicon, amorphous silicon, silicon oxide, gallium arsenide, epitaxial gallium arsenide, gallium aluminum arsenide, epitaxial gallium aluminum arsenide, germanium, or silicon-germanium.

4. The method of claim 1, wherein the flow of ions comprises a flow of $N_2^+$, $N^+$, $NO^+$, $NH_m^+$, $O_2^+$, $Ar^+$, $Xe^+$, or a mixture of $Ar^+$ and $N_2^+$.

5. The method of claim 1, wherein the outer region comprises a first outer region disposed over a first portion of the inner region and a second outer region covering a second portion of the inner region and connecting with the first outer region at a wave crest.

6. The method of claim 5, wherein the first outer region is substantially thicker than the second outer region.

7. The method of claim 6, wherein a thickness of the first outer region is at least 4 nm.

8. The method of claim 6, wherein a thickness of the second outer region is no more than 2 nm.

9. The method of claim 1, wherein the second material is silicon nitride, silicon-germanium nitride, silicon oxide, gallium nitride, gallium oxide, aluminum nitride, aluminum oxide, gallium aluminum nitride, or gallium aluminum oxide.

10. The method of claim 1, wherein the topographic feature is a raised topographic feature.

11. The method of claim 10, further comprising after forming the topographic feature depositing a second layer of a first material to compensate for narrowing of the topographic feature due to ion sputtering during irradiating a surface of the topographic feature by the flow of ions.

12. The method of claim 1, wherein the topographic feature is a recessed topographic feature.

13. The method of claim 1, wherein the two opposing sidewalls of the topographic feature are sloped.

14. The method of claim 1, wherein the substantially periodic array includes N elongated elements where N is a positive integer in a range of 2 to 10.

15. The method of claim 14, wherein N is 2, 3, 4, 5, 6, 7 or 8.

16. A method of forming a hard nanomask for transferring a substantially periodic pattern into a thin film, the method comprising:
   forming a first layer of a first material;
   forming at least two feature sidewalls arising from raised or recessed topographic features in a surface of the first layer, wherein the at least two feature sidewalls are oriented substantially parallel along a first direction and are tilted relative to adjacent portions of the surface of the first layer; and
   irradiating the first layer with a flow of ions in a plurality of irradiation steps alternating between two opposing ion incidence angles relative to an axis normal to the surface of the first layer to form a plurality of nanomask regions, each nanomask region comprising a substantially periodic array of substantially parallel, elongated elements formed on the surface of the first layer and having a wavelike cross-section and being oriented along a first direction, at least some of the substantially parallel, elongated elements having the following structure in cross-section: an inner region of the first material; and an outer region defining opposing nanomask sidewalls and formed of a second material covering portions of the inner region, wherein the second material is formed by modifying the first material using the flow of ions, wherein the nanomask regions are positioned between the at least two feature sidewalls and the at least two features sidewalls do not include the substantially parallel, elongated elements.

17. The method of claim 16, wherein a wavelength of the substantially periodic array is in a range from 20 to 150 nm.

18. The method of claim 16, wherein the first material is silicon, amorphous silicon, silicon oxide, gallium arsenide, epitaxial gallium arsenide, gallium aluminum arsenide, epitaxial gallium aluminum arsenide, germanium, or silicon-germanium.

19. The method of claim 16, wherein the flow of ions comprises a flow of $N_2^+$, $N^+$, $NO^+$, $O_2^+$, $Ar^+$, $Kr^+$, $Xe^+$, or a mixture of $Ar^+$ and $N_2^+$.

20. The method of claim 16, wherein the second material is silicon nitride, silicon-germanium nitride, silicon oxide, gallium nitride, gallium oxide, aluminum nitride, aluminum oxide, gallium aluminum nitride, or gallium aluminum oxide.

* * * * *